United States Patent [19]

Birkle et al.

[11] Patent Number: 5,162,875
[45] Date of Patent: Nov. 10, 1992

[54] PROTECTIVE LAYER FOR ELECTROACTIVE PASSIVATION LAYERS

[75] Inventors: Siegfried Birkle, Hoechstadt A/Aisch; Johann Kammermaier, Unterhaching; Gerhard Schmidt, Forchheim; Rolf-W. Schulte, Erlangen, all of Fed. Rep. of Germany

[73] Assignee: Siemens Aktiengesellschaft, Berlin & Munich, Fed. Rep. of Germany

[21] Appl. No.: 473,619

[22] Filed: Feb. 1, 1990

[30] Foreign Application Priority Data

Feb. 1, 1989 [DE] Fed. Rep. of Germany ....... 3902968

[51] Int. Cl.$^5$ .............................................. H01L 45/00
[52] U.S. Cl. ..................... 257/636; 430/67; 257/63
[58] Field of Search ............ 357/2, 4, 52, 61; 430/66, 67, 73

[56] References Cited

U.S. PATENT DOCUMENTS

| | | | |
|---|---|---|---|
| 4,254,426 | 3/1981 | Pankove | 957/2 |
| 4,322,452 | 3/1982 | Krausse et al. | 427/82 |
| 4,330,182 | 5/1982 | Coleman | 357/61 |
| 4,675,265 | 6/1987 | Kazama et al. | 430/67 |
| 5,000,831 | 3/1991 | Osawa et al. | 427/41 |
| 5,039,358 | 8/1991 | Birkle et al. | 357/2 |

FOREIGN PATENT DOCUMENTS 0284218  9/1988  European Pat. Off. .
WO89/01237  2/1989  European Pat. Off. .

OTHER PUBLICATIONS

IDR-Industrie Diamanten Rundschau, vol. 18 (1984), No. 4, pp. 249-253, "Eigenschaften und Anwendungen harter amorpher Kohlenstoffschichten".

*Primary Examiner*—Andrew J. James
*Assistant Examiner*—Courtney A. Bowers
*Attorney, Agent, or Firm*—Kenyon & Kenyon

[57] ABSTRACT

Hard, mechanically and chemically stable protective layers for electroactive passivation layers of semiconductor components, which also act as diffusion barriers against moisture and ions, comprise a thin layer of amorphous, hydrogenated carbon.

4 Claims, No Drawings

PROTECTIVE LAYER FOR ELECTROACTIVE PASSIVATION LAYERS

Background of the Invention

The invention relates to protective layers in general and more particularly to a protective layer for electroactive passivation layers of semiconductor components and a method for the manufacture of such layers.

Discrete and integrated semiconductor components, particularly those used in MOS-technologies, require electroactive passivation layers due to their sensitivity to static charges. These passivation layers must have special features including a specific resistivity $\geq 10^8 \Omega.cm$, a defect concentration $\geq 10^{19}$ cm$^{-3}$, and good electrical coupling. Layers of amorphous silicon (a-Si) are particularly suitable as electroactive passivation layers. These kinds of layers can be manufactured, by evaporation or sputtering a silicon target, for example (c.f. U.S. Pat. No. 4,322,452).

Electroactive passivation layers of the aforesaid type are very sensitive to moisture and scratches, and also contain a considerable number of so-called "pinholes". Therefore, these layers must be protected by a hard, mechanically and chemically stable second layer. This second, protective layer, however, must not be allowed to negatively influence the electrical properties and the electroactive passivation effect of the underlying a-Si layer.

In integrated circuit technology, and in the case of single transistors, silicon nitride Si$_3$N$_4$ (so-called plasma nitride) has been superimposed on polysilicon or a-Si as a moisture barrier. This procedure is used in mass production since some time, particularly in the case of bipolar module thyristors with operating voltages <2000V. As long as a-Si is manufactured with a specific conductivity $\delta < 10^{-9}$ $\Omega^{-1}.cm^{-1}$ and metallic contamination of the surface is ruled out, the influence of moisture will be small in practice.

However, problems arise in the case of high-insulating components with operating voltages >4000V. In this case, the a-Si layer must be manufactured with a lower resistance in order for there to be sufficient electrical coupling to the substrate; however, as a result the component s becomes more sensitive to environmental influences and contamination. It is therefore necessary to protect the a-Si o layer by means of a second, insulating layer which acts as a diffusion barrier against moisture and ions. Plasma nitride layers are not particularly suitable for this purpose since these kinds of layers have a tendency to form cracks and, therefore, water can pass through them.

In view of these problems in the prior art, there is a need for a hard, mechanically and chemically stable protective layer for electroactive passivation layers of s semiconductor components, which also acts as a reliable diffusion barrier against moisture and ions.

SUMMARY OF THE INVENTION

According to the present invention, this task is accomplished by a protective layer that consists of a thin layer of amorphous hydrogenated carbon (a-C:H).

Amorphous hydrogenated carbon (a-C:H) is a carbon material containing an amorphous carbon lattice. Due to its mechanical hardness, this carbon material is also called diamond-like carbon (c.f., e.g., "IDR—Industrie Diamanten Rundschau", Vol. 18 (1984), NO. 4, pp. 249ff.). This amorphous type of carbon obtains its special properties such as optical transparency, microhardness, chemical resistance and electrical insulation from the juxtaposition of tetrahedral (sp$^3$-) and trigonal (sp$^2$-) hybridization, as well as from the incorporation of hydrogen (approximately 10 to 40 atomic-%).

According to the present invention, the protective layer for electroactively passivated semiconductor components (which is in the form of a-C:H thin-film layers, preferably having a thickness approximately between 0.05 and 3 µm) fulfills to a high degree the demands placed on it. These kinds of layers have diamond-like properties such as high mechanical hardness, scratch resistance, chemical stability and low water permeability. Moreover, the material a-C:H can be manufactured with a variable optical energy gap, a variable defect concentration and, above all, a variable electrical resistance, in contrast to a-Si and a-Si:H, for example. Above all, amorphous hydrogenated carbon layers having the lowest possible defect concentration (in particular a defect concentration $< 10^1$ cm$^{-3}$.eV$^{-1}$ at a specific electrical resistance $\geq 10^{10} \Omega.cm$ at room temperature) are particularly suited for the protective layer according to-o the invention. As a result of these types of layers, the electrical characteristics and the electroactive passivation effect of the underlying passivation layer, which preferably consists of a-Si, are not disturbed; moreover, the passivation layer is well-protected mechanically and it is also protected against moisture.

The protective layer of a-C:H of the present invention has the further advantage that, as a result of the stable C—H bonding, there is no damaging diffusion of hydrogen into the semiconductor structure that is to be protected. This would occur, however, with a-Si:H, for example. Moreover, the adhesion of the a-C:H layers is extraordinarily good, particularly on substrates which consist of elements from the fourth column of the periodic table, and this adhesion is a result of the chemical bonding via carbides. Therefore, the coating of a-Si electroactively passivated semiconductor structures yields, above all, a stable and well-adhering surface coating, since a carbide formation results between the a-Si and the a-C:H.

DETAILED DESCRIPTION

According to the present invention, the manufacture of the protective layer takes place in a manner such that a thin layer of amorphous hydrogenated carbon is applied to an electroactive passivation layer. This is accomplished by a high-frequency, low pressure plasma deposition of gaseous hydrocarbons. The plasma deposition preferably takes place at radio frequencies (RF), i.e., between 0.1 and 100 MHz; however, it can also take place at microwave (MW) frequencies, i.e., between 0.1 and 1000 GHz.

Alkanes, i.e., saturated aliphatic hydrocarbons such as methane, ethane and propane, but preferably methane, are used advantageously as the gaseous hydrocarbons during the manufacture of the protective layer according to the invention. In addition, alkenes, i.e., unsaturated aliphatic hydrocarbons such as ethene and propene, can be used, as well as acetylene, cycloalkanes, i.e., saturated cyclic hydrocarbons like cyclohexane, and, in the gaseous state, aromatic hydrocarbons in the form of benzene and benzene derivatives can also be used. All the above-mentioned hydrocarbons may be used alone or in a mixture. Furthermore, hydrogen and/or noble gases like helium and argon can be added to the hydrocarbons.

In high frequency discharges, particularly with RF-excitation, a d.c. voltage component (a bias voltage or "self-bias potential") up to approximately 1 kV is formed which pulsates due to space charges in step with the high-frequency (HF). This d.c. voltage component is formed in the case where the interior electrodes of the discharge device vary in size (surface ratio $\leq 0.5$, and preferably between 0.25 and 0.05) This d.c. voltage component overlaps with the HF-a.c. voltage and turns the smaller electrode into a cathode. In this manner, with the formation of the a-C:H, the charged $C_xH_y$ particles, which arise through ionization and fragmentation of the reaction gas, are accelerated toward the cathode and deposited with high kinetic energy on the substrate that is mounted in front of the cathode. In order to keep the substrate temperature as low as possible ($\leq 250°$ C.) and thus achieve the highest possible $sp^3$-fraction in the a-C:H ($>60\%$), the anode is advantageously designed in a cup shape. Although it is on a much smaller scale due to the lack of interior electrodes, a "self-bias" effect of the type mentioned above also occurs in the case of microwave-induced deposition plasmas because there is a potential difference between the plasma and the substrate surface.

The invention is more fully described by the following example.

For plasma deposition of a-C:H by radio frequency-excitation, methane $CH_4$ (as the reaction gas) is introduced at a pressure of 100 Pa in an apparatus which is in the form of a cylindrical glass container. The reaction gas reaches the plasma that is created between two differently sized electrodes (surface ratio: 1:4); the plasma has a volume of approximately 400 cm$^3$. Both of the electrodes are connected to a radio frequency generator ($\nu = 13.56$ MHz). Because the electrodes are of a different size, a self biasing d.c. voltage arises between these electrodes and is superimposed on the radio frequency voltage As a result, the smaller electrode, which carries the a-Si passivated semiconductor parts to be coated, becomes a cathode. A disturbing electrical influence of the plasma on the semiconductor components during the coating with a-C:H is essentially eliminated by means of the a-Si layer.

In the Case Of a high-frequency power density of approximately 2.2 W.cm$^{-2}$ with respect to the cathode surface, a self-biasing d.c. voltage of up to approximately 500V arises between the two electrodes. Under these conditions, one obtains an approximately 0.2 $\mu$m thick a-C:H layer with diamond-like properties and an $H_2O$ permeation coefficient of $<3\times10^{-13}$ m$^2$.s$^1$ after one minute (deposition rate: approximately 3 nm.s$^{-1}$) at a $CH_4$ mass flow rate of $8.8\times10^4$ Pa.cm$^3$.s$^{-1}$. Due to the very high specific electrical resistance ($\leq 10^{10}\Omega$.cm) and a defect concentration $<10^{17}$ cm$^{-3}$.eV$^{-1}$ in the a-C:H layer, the electroactive passivation effect of the underlying a-Si layer is not negatively influenced.

We claim:

1. A protective layer for an electroactive passivation layer of a semiconductor component comprising a thin layer of amorphous, hydrogenated carbon (a-C:H), wherein said protective layer has a defect concentration $\leq 10^{17}$ cm$^{-3}$ eV$^{-1}$ and a specific electrical resistance $\geq 10^{10}$ $\Omega$ cm.

2. The protective layer according to claim 1, wherein said protective layer has a thickness between approximately 0.05 and 3 $\mu$m.

3. The protective layer according to claim 1, wherein said electroactive passivation layer consists of amorphous silicon.

4. The protective layer according to claim 2, wherein said electroactive passivation layer consists of amorphous silicon.

* * * * *